United States Patent [19]

Mahulikar et al.

[11] Patent Number: 5,213,638
[45] Date of Patent: May 25, 1993

[54] SURFACE MODIFIED COPPER ALLOYS

[75] Inventors: Deepak Mahulikar, Madison; Brian Mravic, North Haven, both of Conn.

[73] Assignee: Olin Corporation, New Haven, Conn.

[21] Appl. No.: 828,329

[22] Filed: Jan. 30, 1992

Related U.S. Application Data

[63] Continuation-in-part of Ser. No. 563,766, Jul. 27, 1990, Pat. No. 5,096,508.

[51] Int. Cl.$^5$ .............................................. C22C 9/00
[52] U.S. Cl. ..................................... 148/627; 428/671
[58] Field of Search ....................... 428/671; 148/627

[56] References Cited

U.S. PATENT DOCUMENTS

| | | | |
|---|---|---|---|
| 4,043,839 | 8/1977 | Hartline, III et al. | 148/20.3 |
| 4,352,698 | 10/1982 | Hartley et al. | 148/4 |
| 4,412,899 | 11/1983 | Beale | 204/192 R |
| 4,436,560 | 3/1984 | Fujita et al. | 427/431 |
| 4,451,302 | 5/1984 | Prescott et al. | 148/437 |
| 4,500,605 | 2/1985 | Fister et al. | 428/652 |
| 4,643,859 | 2/1987 | Mitomo et al. | 264/65 |
| 4,656,499 | 4/1987 | Butt | 357/74 |
| 4,692,191 | 9/1987 | Maeda et al. | 148/6.12 |
| 4,693,760 | 9/1987 | Sioshansi | 148/421 |
| 4,756,791 | 7/1988 | D'Angelo et al. | 156/610 |
| 4,784,974 | 11/1988 | Butt | 437/221 |
| 4,799,973 | 1/1989 | Mahulikar et al. | 148/435 |
| 4,961,457 | 10/1990 | Watson et al. | 164/46 |

FOREIGN PATENT DOCUMENTS

| | | |
|---|---|---|
| 0310952 | 12/1988 | Japan. |
| PCT/GB88/-01106 | 6/1989 | PCT Int'l Appl.. |
| 0002385 | 4/1986 | World Int. Prop. O.. |

OTHER PUBLICATIONS

Computer Search Rept., Aug. 1992, US-PTO. L1-L9; see L1, L3 and L8.

L1 et al. Appl. Phys. Letts. 60 (1992) 2983, see ref. 5 therein.

Metallurgical Transactions A. vol. 15A. Dec. 1984 entitled "The Wear Behavior of Nitrogen-Implemented Metals" by W. C. Oliver; R. Hutchings and J. B. Pethica, pp. 2221-2229.

The Mit Press, Cambridge, Mass., "Ion Implantation Metallurgy" by M. T. Clapp and L. E. Rehn. pp. 2412-2415.

*Primary Examiner*—Upendra Roy
*Attorney, Agent, or Firm*—Gregory S. Rosenblatt; Paul Weinstein

[57] ABSTRACT

There is provided a composite copper alloy having a copper alloy core and a modified surface layer containing a nitride or carbide film. Alternatively, the modified surface layer may contain a carbo-nitride film. The alloy is formed by reacting a copper alloy with nitrogen, carbon or a nitrogen/carbon mixture at elevated temperatures. The resultant surface layer improves the tribological and mechanical properties of the alloy while maintaining useful electrical conductivity.

14 Claims, 1 Drawing Sheet

SURFACE MODIFIED COPPER ALLOYS

CROSS-REFERENCE TO RELATED APPLICATION

This patent application is a continuation-in-part of U.S. Ser. No. 563,766, filed Jul. 27, 1990, now U.S. Pat. No. 5,096,508 entitled "Surface Modified Copper Alloys" by John F. Breedis et al, issued Mar. 17, 1992.

FIELD OF THE INVENTION

The invention relates to a method to modify the surface of a copper alloy more particularly, a non-metallic precipitate is formed at the surface of the alloy to modify wear resistance, durability and/or color.

BACKGROUND OF THE INVENTION

Copper alloys are widely used in electrical, electronic and architectural applications. The alloys have excellent electrical characteristics but the mechanical properties are less than ideal. The alloys are soft and subject to frictional and erosive wear. The alloys readily oxidize and because copper oxide is a poor conductors of electricity, the oxide causes an increase in contact resistance.

Oxidation can be minimized by coating the alloy with a second metal such as tin or gold. However, the coatings do not improve the hardness or wear resistance of the substrate.

Various alloying elements may be added to molten copper to increase wear resistance and hardness as well as to improve oxidation resistance. The additions usually cause a decrease in electrical conductivity.

As disclosed in U.S. Pat. No. 5,096,508 07/563,766, which is incorporated by reference in its entirety herein, the surface of a copper alloy may be modified by nitriding. The process changes the characteristics of the surface to a depth of from a few angstroms to about 1 micron.

U.S. Pat. No. 4,693,760 issued to Sioshansi discloses modifying the surface of a titanium alloy with carbon or nitrogen by ion-implantation. An article by Oliver et al entitled The Wear Behavior of Nitrogen-implanted Metals details how the wear characteristics of titanium alloys, hard chromium plate and ferrous metals are improved by nitriding the surface by ion-implantation.

Elemental copper has low reactivity with nitrogen and carbon and nitriding or carbiding by conventional means, such as used to nitride steel, does not produce a significantly improved surface.

A boride modified copper surface is disclosed in U.S. Pat. No. 4,436,560 to Fujita et al. A copper substrate is alloyed with a metal which reacts with boron. Boron is brought into contact with the alloy by immersion in a molten boron salt, fluid bed deposition or vapor deposition. The resultant surface has a dispersion of fine boride particles in a copper matrix. The dispersoids occupy from 1 to 50% of the surface volume.

The technique of U.S. Pat. No. 4,436,560 is only suitable when the precipitate former (boron) is soluble in the host matrix (copper). Both carbon and nitrogen are not significantly soluble in copper and the process is not suitable for forming nitride or carbide precipitates at the surface of a copper alloy.

A method of modifying the surface of alloy steels is disclosed in U.S. Pat. No. 4,692,191 to Maeda et al. The patent discloses immersing the substrate in an oxidizing acid or salt and irradiating selected surface areas with a laser pulse The irradiated surface formed a passive oxide surface layer. The oxide may be a different color than the base metal and by irradiating selected portions of the substrate, a polychromatic surface is obtained.

SUMMARY OF THE INVENTION

Accordingly, it is an object of the invention to provide a copper alloy having a modified surface. It is a feature of the invention that the surface is modified by reaction with a nitrogen or carbon at elevated temperatures. It is a further feature of the invention that the copper alloy includes at least one element which is both soluble in copper and reactive with the gas.

It is a benefit of the invention that the nitrided or carburized surface is a continuous film and unlike other nitrogen deposition methods such as chemical vapor deposition (CVD) or plasma vapor deposition (PVD), interior surfaces are readily modified. Yet another benefit is the process is less expensive than CVD or PVD.

Another benefit of the invention is that the surface modified copper alloy has improved mechanical properties such as wear resistance and hardness and the modified alloy is resistant to oxidation and corrosion. Despite surface modification, the bulk electrical properties of the alloy remain essentially unchanged. Still another benefit of the invention is that the surface of the alloy may be imparted with a permanent color.

Hybrid modified surfaces such as a carbo-nitride are obtainable by the process of the invention. Additionally, other metallic systems which are not amenable to nitriding or carbiding, such as various nickel and iron alloys can be modified by the process.

In accordance with the invention, there is provided a composite copper alloy. The alloy has a core CuQ where Q is at least one element both partially soluble in copper and reactive with nitrogen or carbon. The composite further contains a surface layer having either the formula $Q_aN$ or $Q_aC$ where a is a value greater than zero. The surface is modified by reacting the alloy with either a nitrogen or carbon containing gas.

The above stated objects, features and benefits will become more apparent from the specification and drawings which follow.

DETAILED DESCRIPTION

Figure 1:
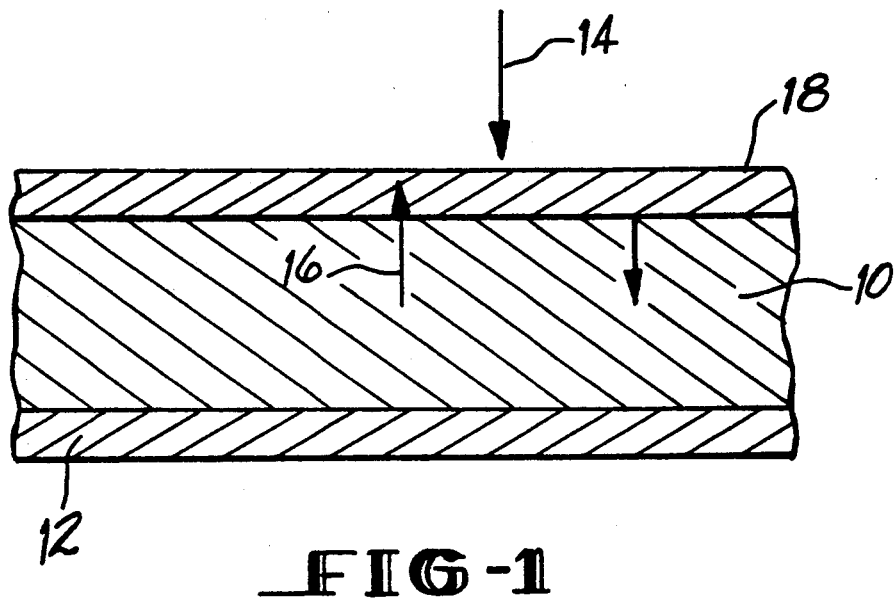
FIG. 1 shows a metallic substrate prior to surface modification in accordance with one embodiment of the invention.

The composite copper alloys of the invention have a core with the general composition CuQ and a modified surface layer $Q_aN$ or $Q_aC$ surrounding the core. Q is at least one element both soluble in copper and reactive with either nitrogen or carbon. N is nitrogen and C is carbon. "a" is any value greater than zero and reflects the stoichiometry of the nitride or carbide surface layer. "a" (as well as "b" and "c" discussed below) may be any fractional value and is not necessarily an integer.

When Q reacts with either nitrogen or carbon or a mixture thereof, the resulting nitride, carbide or carbo-nitride is substantially insoluble in copper. Solubility in the context of this application refers to solid state solubility. The component Q alloys with copper to form a matrix of Q with "b" weight percent copper. $Q_aN$ and $Q_aC$ are either not soluble or only slightly soluble in the matrix. Q diffuses to the surface of the alloy and combines there with nitrogen or carbon to form the nonmetallic surface film.

The surface film has a thickness of from about 10 angstroms to in excess of about 10 microns. A more preferred thickness of the surface layer is from about 0.01 to about 2.5 microns. The required thickness s dependent on the intended use of the surface modified alloy. For an electrical application, a lower thickness, i.e. 0.01 to 0.5 microns is satisfactory, while for architectural or marine applications a higher thickness, i.e. 1.5–2.5 microns may be required.

The alloying component, Q, is selected to improve the mechanical and thermal properties of the copper alloy. Hardness, resistance to thermally induced softening, wear resistance, corrosion resistance and oxidation resistance are all improved by proper selection of the alloying component. The color of the surface modified alloy is also determined by the selection of Q. The requirements imposed on Q are solubility in copper and reactivity with either nitrogen or carbon.

When the reactive atmosphere contains nitrogen, preferred elements for Q include aluminum, beryllium, chromium, hafnium, niobium, silicon, tantalum, titanium, tungsten, vanadium, zirconium, iron and mixtures of those elements. For corrosion resistance, the most preferred elements, Q, are titanium, chromium, beryllium and mixtures thereof.

When the reactive atmosphere contains carbon, the additive Q may be selected from the group consisting of aluminum, beryllium, chromium, niobium, silicon, tantalum, titanium, tungsten, vanadium, zirconium and iron. For corrosion resistance, the preferred elements, Q are titanium, chromium, beryllium, aluminum and mixtures thereof.

The effective concentration of Q is that which forms a surface layer having improved tribological, mechanical and chemical properties. If the surface modified component is to be used in an electrical application, the concentration of Q is sufficiently low to retain useful electrical conductivity. The concentration of Q is preferably from about 0.1 to about 10 weight percent. Most preferably, the concentration of Q is from about 1 to about 3 wt. %.

The copper alloys are not limited to $Cu_bQ$. Alloys of the form $Cu_bX_cQ$ are within the scope of the invention. X may be any element such as zinc, nickel, tin, cobalt, iron, manganese or a combination of elements which is conventionally alloyed with copper. Q is selected to be at least partially soluble in CuX and reactive with either nitrogen or carbon. X is preferably soluble in copper and less reactive than Q with nitrogen or carbon.

Two preferred elements, X, are nickel and zinc. Cu-Ni-Q alloys having a nitride modified surface have improved corrosion resistance over nitride modified alloys $Cu_bQ$. When the nickel content is from about 5 to about 30 percent by weight, these alloys also have suitable magnetic and electrical properties for coinage. Cu-Zn-Q alloys could provide a tarnish resistant brass.

The copper alloys are formed by casting an ingot $Cu_bQ$ or $Cu_bX_cQ$. Casting may be by any conventional means such as direct chill casting. The alloy is cooled to form an ingot of either a homogeneous or uniform multi-phase alloy. The ingot is formed into a desired shape by rolling, forging or other conventional mechanical means. For example, the ingot may be rolled to a strip and stamped into electrical connectors or coin blanks.

The ingot may be machined into plumbing or marine hardware or otherwise formed into a useful shape. After forming, the surface is modified.

The surface is modified by reacting Q with nitrogen, carbon or a mixture thereof dependent on whether a nitride, carbide or carbo-nitride modified surface is desired. Any method which contacts the surface with nitrogen or carbon at elevated temperatures is acceptable such as ion implantation or fluid bed immersion. To generate a surface film, $Q_aN$, $Q_cC$ or $Q_aCN$ exposure to a controlled atmosphere is most preferred. Unlike ion implantation or CvD which require a direct line of sight between the nitrogen or carbon source and the surface to be modified, the controlled atmosphere will penetrate and modify shielded areas such as the inside of a tube.

For a nitride film, the copper alloy is placed in a nitrogen containing atmosphere and heated to a temperature of from about 600° C. to about 1000° C. to form a nitride film. More preferably, the temperature is in the range of about 700° C. to about 900° C. A suitable dwell time is from about 10 minutes to about 24 hours and more preferably, from about 1 to 4 hours. The substrate is then cooled in the nitrogen atmosphere to prevent oxidation. The presence of certain elements in the alloy, for example Q being titanium or chromium or X being nickel result in a precipitation hardenable alloy. These alloys can be heat treated after surface modification to achieve desired properties. The heat treatment could consist of controlled cooling after surface modification or a subsequent aging treatment.

Suitable nitrogen containing gases include pure nitrogen, ammonia or a mixture of nitrogen and hydrogen (such as 96% by volume $N_2$/4%$H_2$ or and cracked ammonia (25vol %$N_2$/75%$H_2$) Selection of the nitrogen containing gas is influenced by the reaction potential between nitrogen and the element Q. Ammonia is more reactive than nitrogen which is more reactive than a mixture of nitrogen and hydrogen.

The reactivity of the nitrogen, the temperature, the dwell time, the diffusivity of Q in copper, the diffusivity of Q in the nitride and the electrical conductivity (rate of electron transport) of the nitride film all influence the thickness of the generated QN film.

Similar temperature and dwell times are suitable for carburization. To generate a $Q_aC$ film, a carbon containing gas is reacted with the copper alloy substrate at elevated temperatures. Suitable carburization gases include methane, other hydrocarbons, a mixture of carbon dioxide and carbon monoxide and, a mixture of a hydrocarbon and hydrogen. A mixture of hydrocarbon and hydrogen is preferred with the concentration of hydrocarbon being that effective to carbide the surface without producing soot. At the temperatures and dwell times utilized by Applicants, up to 2vol. % hydrocarbon is satisfactory. One exemplary atmosphere is is 1.5% by volume methane and the remainder hydrogen. A low carbon gas is preferred to reduce the formation of soot on the substrate Another suitable surface modification is a carbonitride surface. Reacting the $Cu_bQ$ or $Cu_bX_cQ$ alloy with a mixture of containing both carbon and nitrogen will produce this surface modification. A suitable method is elevated temperature exposure to a mixture of nitrogen and a hydrocarbon. The hydrocarbon being present in an effective concentration to produce a carbide without the generation of soot. One exemplary atmosphere is $CH_4/N_2$ with about 2vol. % methane.

A suitable $Q_aC$ or $Q_aN$ film has a degree of ductility so a formed surface modified component may flex during operation without cracking or delamination of the surface layer. As indicated by Tables 1-5, the surface modified coatings of the present invention meet these requirements.

The following Examples demonstrate the properties of the surface modified alloys of the invention. The Examples are illustrative and not intended to limit the scope of the invention.

EXAMPLE 1

Ductility

Copper alloy, Cu-X-Q, with a variety of alloying additions, Q, and a thickness of 0.020 inches were surface modified by heating to 900° C. for 120 minutes in a nitriding or carburizing atmosphere. For nitriding, a mixture of 96vol. % $N_2$/4%$H_2$ was utilized. For carburizing, a mixture of 1.5% vol. % $CH_4$/98.5% $H_2$ was used.

After surface modification, the strip was bent around a ½" diameter mandrel such that R/t (radius/thickness) was approximately 25. The results are summarized in Table 1. Those coatings which cracked are identified as "fail" and those which did not crack were identified as a "pass".

While the coatings which failed cracked, those coatings did not flake from the substrate indicative of good adhesion notwithstanding the brittleness of the surface.

TABLE 1

| Alloy Composition (weight percent) | | | Surface Modification | |
|---|---|---|---|---|
| Cu | X | Q | Nitride | Carbide |
| 99.5% | — | .5% Ti | fail | fail |
| 99.0% | — | 1% Ti | fail | N.T.* |
| 98.0% | — | 2% Ti | fail | fail |
| 98.0% | — | 2% Cr | pass | pass |
| 98.0% | — | 2% Al | N.T. | pass |
| 98.0% | — | 2% Si | pass | pass |
| 73.5% | 26% Ni | .5% Ti | pass | N.T. |
| 73.0% | 26% Ni | 1% Ti | pass | pass |
| — | — | 100% Ti | fail | N.T. |
| 98.2% | .4% Mg 1% Ni | .4% Be | N.T. | pass |
| 98.1% | — | 1.8% Be | pass | pass |
| 99.9% | — | .1% Zr | N.T. | pass |

*N.T. indicates "not tested"

EXAMPLE 2

Corrosion Resistance

Corrosion resistance of the surface modified samples was evaluated by measuring the weight gain following exposure to a corrosive atmosphere. The gain in weight is a result of the generation of corrosion by-products. The smaller the weight gain, the better the corrosion resistance.

A series of copper alloys were surface modified by exposure to 96vol. % $N_2$/4%$H_2$ at 850° C. for 120 minutes. A second series of the same alloys was modified by exposure to 1.5vol. % $CH_4$/98.5% $H_2$ for 120 minutes. The samples, along with a copper control were immersed in a water bath at room temperature for 96 hours. The weight gain is recorded in Table 2. To demonstrate that the improved corrosion resistance was from surface modification rather than the alloy constituents, the corrosion resistance of the alloy prior to surface modification was also evaluated.

TABLE 2

| Alloy Composition (weight percent) | | | Increase in Weight (micrograms/centimeter²) | | |
|---|---|---|---|---|---|
| | | | | Surface Modified | |
| Cu | X | Q | Untreated | Nitride | Carbide |
| 98.1% | — | 1.9% Be | 0.0 | 0.0 | 4.8 |
| 73% | 26% Ni | 1% Ti | 0.0 | 0.0 | 0.0 |
| 98% | — | 2% Cr | 17.3 | 0.0 | −6.3* |
| 98% | — | 2% Ti | 11.2 | 4.6 | 0.0 |
| 98% | — | 2% Al | 9.0 | 9.5 | 4.4 |
| 100% | — | — | 16.3 | 14.8 | 12.2 |
| 98% | — | 2% Si | 9.5 | 19.0 | 4.8 |

*a negative weight gain is due to the surface modified layer flaking and considered an anomaly.

The same series of copper alloys was surface modified by exposure to either 1.5vol. % $CH_4$/98.5% $H_2$ at 850° C. for 120 minutes or 96vol. % $N_2$/4%$H_2$ at 850° C. for 120 minutes. The samples, along with a copper control were exposed to steam for 24 hours. The change in weight was determined and reproduced as Table 3.

TABLE 3

| Alloy Composition (weight percent) | | | Increase in Weight (micrograms/centimeter²) | | |
|---|---|---|---|---|---|
| | | | | Surface Modified | |
| Cu | X | Q | Untreated | Nitride | Carbide |
| 73 | 26% Ni | 1% Ti | 10.5 | 0.0 | 6.4 |
| 98% | — | 2% Cr | 12.4 | 0.0 | 14.2 |
| 98% | — | 2% Ti | 15.4 | 2.3 | 0.0 |
| 98% | — | 2% Al | 13.8 | 11.1 | 8.3 |
| 98.1% | — | 1.9% Be | 18.7 | 11.2 | 0.0 |
| 100% | — | — | 14.6 | 13.0 | 21.0 |
| 98% | — | 2% Si | 101.5 | 36.7 | 30.2 |

The same copper alloys were surface modified by exposure to 96vol. % $N_2$/4% $H_2$ at 850° C. for 120 minutes or 1.5vol. % $CH_4$/98.5% $H_2$ at 850° C. for 120 minutes. The samples, along with a copper control were exposed to air at 300° C. for 24 hours. The change in weight was then determined as reproduced in Table 4.

TABLE 4

| Alloy Composition (weight percent) | | | Increase in Weight (micrograms/centimeter²) | | |
|---|---|---|---|---|---|
| | | | | Surface Modified | |
| Cu | X | Q | Untreated | Nitride | Carbide |
| 98.1% | — | 1.9% Be | 22.0 | 0.0 | 45.0 |
| 98% | — | 2% Ti | 197.8 | 0.0 | −3.7* |
| 73% | 26% Ni | 1% Ti | 8.0 | 0.0 | 109.9 |
| 98% | — | 2% Al | 52.4 | 8.5 | 23.1 |
| 98% | — | 2% Si | 87.4 | 45.4 | 26.9 |
| 98% | — | 2% Cr | 90.1 | 88.0 | 12.5 |
| 100% | — | — | 78.2 | 97.8 | 138.4 |

*a negative weight gain is due to the surface modified layer flaking an is considered an anomaly.

In a second embodiment of the invention, the color of the copper alloy is influenced by Q. Materials formed according to this embodiment have application in architecture and other areas where decorative metallic components are exposed to the environment. One example is an automotive applications. The materials are also useful where a desired color is required along with specific magnetic and electrical properties, such as a gold colored coin.

Tables 5 and 6 indicate the colors obtainable by the process of the invention.

TABLE 5

| Surface Color - Nitrides | |
|---|---|
| Composition of Q | Color |
| Aluminum | transparent |
| Beryllium | transparent |
| Hafnium | yellow-brown |
| Niobium | black |
| Silicon | grey |
| Tantalum | black |
| Titanium | gold |
| Tungsten | brown |
| Vanadium | black |
| Zirconium | yellow |
| Iron | grey |

TABLE 6

| Surface Color - Carbides | |
|---|---|
| Composition of Q | Color |
| Aluminum | yellow/green |
| Beryllium | yellow |
| Chromium | grey |
| Niobium | black |
| Silicon | black |
| Tantalum | black |
| Titanium | metallic green |
| Tungsten | black |
| Vanadium | black |
| Zirconium | metallic grey |
| Iron | grey |

From Table 5, a gold colored coin having the magnetic and electrical properties of a copper/nickel alloy can be formed by adding an effective amount of titanium to a copper/nickel alloy. Applicants have verified that the nitriding of a copper/26% by weight nickel/0-.5-1% by weight titanium alloy will become gold colored after elevated temperature exposure to a cracked ammonia atmosphere. Other copper based coinage alloys such as copper-nickel-zinc; copper-nickel-tin; copper-nickel-aluminum; copper-nickel-iron; copper-tin (bronzes) may also be imparted with a yellow color according to the method of the invention.

Copper alloys having a yellow color, notably brasses (Cu-Zn alloys) such as Cu-Zn-Al while not requiring the method of the invention to achieve a yellow color are also improved. The modified surface has improves the tarnish these alloys.

While the invention has been described in terms of copper based alloys, other base metals which are not amenable to nitriding, carbiding or carbo-nitriding may also be surface modified by the process of the invention. Such base metals include, nickel, iron and various alloys thereof.

Figure 2:
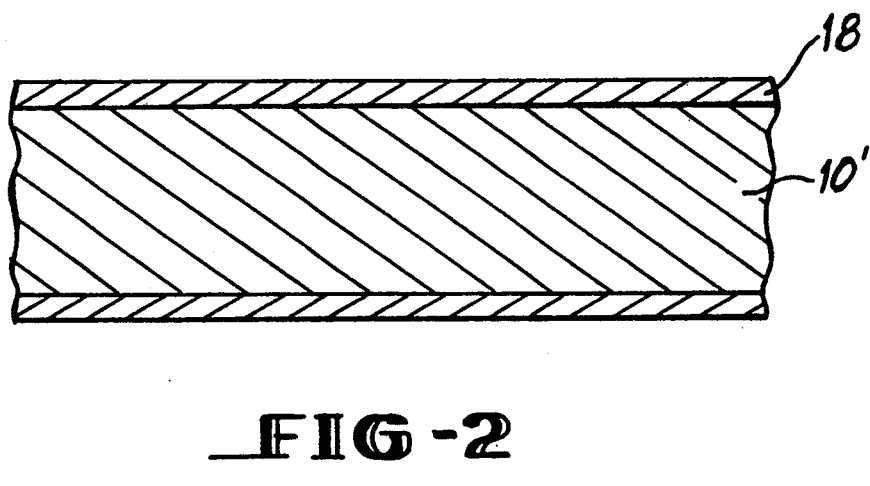
FIG. 2 shows the metallic substrate subsequent to surface modification.

A modification of the process is illustrated in FIGS. 1 and 2. With reference to FIG. 1, an iron based substrate 10 contains an alloying addition capable of forming a nitride or carbide such as chromium or titanium. Preferably, the alloying addition is selected to have a diffusivity rate in copper which is greater than the diffusivity rate of iron in copper.

The iron based substrate is then coated with a barrier layer 12 of a metal in which the solubility of nitrogen or carbon is negligible. One suitable barrier layer 12 is copper. The layer 12 is coated by any suitable process such as immersion coating, electroplating or cladding. The coated material is then heated in a controlled atmosphere containing the desired surface modification gas 14 which may be nitrogen, carbon, or a mixture thereof. During heating, the alloying addition diffuses through the copper layer 12 as indicated by reference arrow 16 to the surface of the coated substrate where it reacts with the surface modification gas 14 forming a modified surface 18. Concurrently, the layer of copper 12 diffuses into the iron based substrate 10.

The resultant structure is illustrated in FIG. 2. The iron based substrate 10' has a slightly different composition than prior to surface modification. The iron based substrate 10' contains copper and has a reduced concentration of the alloying addition. The modified surface 18 is of the form $Q_aC$ or $Q_aN$ as described above.

While described in terms of iron based alloys, the preceding technique is amenable to other alloy systems such as nickel.

The publication and patents set forth in the application are intended to be incorporated by reference in their entireties.

It is apparent that there has been provided in accordance with this invention copper alloys with a nitrided or carburized surface and a process to manufacture the alloys which fully satisfy the objects, means and advantages set forth herein above. While the invention has been described in combination with specific embodiments thereof, it is evident that many alternatives, modifications and variations will be apparent to those skilled in the art in light of the forging description. Accordingly, it is intended to embrace all such alternatives, modifications and variations as fall within the spirit and broad scope of the appended claims.

We claim:

1. A composite copper alloy, comprising:
   a core $Cu_bX_cQ$; and
   a surface layer $Q_aC$ about 10 microns, where Q is at least one element which is both partially soluble in copper and reactive with carbon, X is at least one element partially soluble in copper and less reactive with carbon than Q, and "a" and "b" are each greater than the zero and "c" is at least zero".

2. The composite copper alloy of claim 1 wherein Q is selected from the group consisting of aluminum, beryllium, chromium, niobium, silicon, tantalum, titanium, tungsten, vanadium, zirconium and mixtures thereof.

3. The composite copper alloy of claim 1 wherein X is selected from the group consisting of zinc, nickel, tin, cobalt, iron and manganese and mixtures thereof.

4. The composite copper alloy of claim 1 wherein "c" is greater than zero.

5. The composite copper alloy of claim 1 wherein "c" is equal to zero.

6. The composite copper alloy of claim 3 wherein Q is selected from the group consisting of titanium, chromium, beryllium and aluminum.

7. The composite copper alloy of claim 5 wherein Q is selected from the group consisting aluminum, beryllium, chromium, iron, niobium, silicon, tantalum, titanium, tungsten, vanadium, zirconium and mixtures thereof.

8. The composite copper alloy of claim 6 wherein the total concentration of Q in said core and surface layer is from about 1 to about 10 weight percent.

9. The composite copper alloy of claim 7 wherein Q is selected from the group consisting of titanium, chromium, beryllium and aluminum.

10. The composite copper alloy of claim 8 wherein said surface layer is a film $Q_aC$.

11. The composite copper alloy of claim 9 wherein the total concentration of Q in said core and said surface layer is from about 1 to about 10 weight percent.

12. The composite copper alloy of claim 10 wherein said surface layer has a thickness of from about 0.01 microns to about 2.5 microns.

13. The composite copper alloy of claim 11 wherein said surface layer is a film $Q_aC$.

14. The composite copper alloy of claim 13 wherein said surface layer has a thickness of from about 0.01 microns to about 2.5 microns.

* * * * *